United States Patent [19]

Sato et al.

[11] Patent Number: 5,286,296
[45] Date of Patent: Feb. 15, 1994

[54] MULTI-CHAMBER WAFER PROCESS EQUIPMENT HAVING PLURAL, PHYSICALLY COMMUNICATING TRANSFER MEANS

[75] Inventors: Junichi Sato, Tokyo; Toshiaki Hasegawa; Hiroshi Komatsu, both of Kanagawa, all of Japan

[73] Assignee: Sony Corporation, Tokyo, Japan

[21] Appl. No.: 818,535

[22] Filed: Jan. 9, 1992

[30] Foreign Application Priority Data

Jan. 10, 1991 [JP] Japan .................. 3-001316
Jan. 22, 1991 [JP] Japan .................. 3-005428
Jan. 31, 1991 [JP] Japan .................. 3-010652

[51] Int. Cl.$^5$ ............... C23C 16/00; A61K 27/02
[52] U.S. Cl. .................... 118/719; 118/729; 204/298.25; 204/298.26; 204/298.35; 414/217; 414/225; 437/925
[58] Field of Search .......... 204/298.25, 298.26, 204/298.35; 118/719, 729, 730, 503; 414/217, 225; 437/925

[56] References Cited

U.S. PATENT DOCUMENTS

| | | | |
|---|---|---|---|
| 4,473,455 | 9/1984 | Dean et al. ................... | 204/298 |
| 4,498,416 | 2/1985 | Bouchaib ..................... | 118/719 |
| 4,605,469 | 8/1986 | Shih et al. .................. | 118/503 |
| 4,643,627 | 2/1987 | Bednorz et al. ............... | 414/217 |
| 4,664,062 | 5/1987 | Kamohara et al. .............. | 118/719 |
| 4,715,921 | 12/1987 | Maher et al. ................ | 204/298.35 |
| 4,810,473 | 3/1989 | Tamura et al. ............... | 118/730 |
| 4,818,327 | 4/1989 | Davis et al. ................ | 156/345 |
| 4,923,584 | 5/1990 | Bramhall, Jr. et al. ........ | 204/298.25 |
| 4,951,601 | 8/1990 | Maydan et al. ............... | 118/729 |
| 5,067,218 | 11/1991 | Williams .................... | 118/729 |
| 5,076,205 | 12/1991 | Vowles et al. ............... | 204/298.35 |
| 5,100,502 | 3/1992 | Murdoch et al. .............. | 204/298.35 |

*Primary Examiner*—Olik Chaudhuri
*Assistant Examiner*—David E. Graybill
*Attorney, Agent, or Firm*—Hill, Steadman & Simpson

[57] ABSTRACT

In a multi-chamber process equipment in which a plurality of process chambers for processing a single wafer are connected with a wafer transfer chamber in parallel through respective gate valves, and a wafer transfer means is provided for carrying the wafer between the wafer transfer chamber and each process chamber through one of the gate valves, there are further provided a plurality of vacuum pumps in order to prevent cross contamination among processes, improve throughput and prevent condensation in the process chambers. The vacuum pumps are connected with the wafer transfer chamber, and designed to reduce the pressure in the wafer transfer chamber to different vacuum levels. Therefore, the degree of vacuum in the wafer transfer chamber can be set at a desired value according to the process chamber to be opened, by operating the vacuum pumps properly, so that cross contamination between the wafer transfer chamber and the process chambers is prevented effectively.

2 Claims, 11 Drawing Sheets

MULTI-CHAMBER WAFER PROCESS EQUIPMENT HAVING PLURAL, PHYSICALLY COMMUNICATING TRANSFER MEANS

BACKGROUND OF THE INVENTION

1. Field of the Invention

The present invention relates to multi-chamber process equipments for fabricating semiconductor devices.

2. Description of the Prior Art

In recent years, the advance in device miniaturization and IC complexity is increasing the need for more accurate and more complicated processes, and wafers of larger diameters. Accordingly, much attention is focused on multi-chamber process equipments (or systems) in view of increase of complex precesses, and enhancement of throughput in an individual wafer processing system.

FIG. 14 shows one conventional example. A multi-chamber process equipment of this example includes a wafer transfer chamber 1, a plurality of process chambers 3 connected with the transfer chamber 1 through respective gate valves 2, a load lock chamber (preliminary evacuation chamber) 5 connected with the transfer chamber 1 through a gate valve 4, and a wafer load chamber 7 connected with the load lock chamber 5 through a gate valve 6.

In the wafer transfer chamber 1 and the load lock chamber 5, there are provided wafer transfer arms 9 and 10 for carrying a wafer 8, as shown in FIG. 14. The transfer arm 10 is designed to take each wafer 8 from wafer cassettes 11, 11 placed in the wafer load chamber 7, through the gate valve 6, and bring the wafer into the wafer transfer chamber 1. The transfer arm 9 is arranged to receive the wafer 8 from the arm 10, and insert the wafer through one of the gate valves 2 into a predetermined one of the process chambers. The wafer 8 is shifted from one process chamber to another by the transfer arm 10 according to the sequence of processes.

Another conventional example is shown in "NIKKEI MICRODEVICES", May, 1990, page 47. A multi-chamber process equipment of this example includes a wafer transfer chamber, a plurality of parallel PVD or other process chambers connected with the transfer chamber, a cooling chamber, a preclean chamber, a buffer chamber, and RTP/etching/CVD chamber (or chambers), a load lock chamber, and other chambers. The pressure of each chamber is held at a predetermined degree of vacuum (base pressure) according to the object of the chamber. For example, the wafer transfer chamber is held at $10^{-8}$ Torr ($1.3\times10^{-6}$ Pa), the PVD chamber is held at $10^{-9}$ Torr ($1.3\times10^{-7}$ Pa), and the load lock chamber is held at $10^{-5}$ Torr ($1.3\times10^{-3}$ Pa).

Japanese Patent Provisional Publication (TOKKAI) No. 61-55926 shows still another conventional example.

In these equipments, the pressures of the different chambers are determined so as to ensure the clean wafer processing environment. In general, the pressures are made closer to the atmospheric pressure in the following order; (Process chamber)<(Wafer transfer chamber)<(Load lock chamber).

In the conventional process equipments, however, a wafer is readily affected by dew condensation especially in a low temperature etching chamber which is cooled to $-20°$ C. $\sim -70°$ C. if the chamber is not evacuated sufficiently before loading of the wafer. Therefore, it is required to reduce the pressure in the chamber below a base pressure of the chamber ($10^{-6}$ Torr, for example). Moreover, the degree of vacuum of the wafer transfer chamber is lower (that is, the pressure is higher) than that of the process chamber. Therefore, when the process chamber is opened, there arises a flow of residual water content from the wafer transfer chamber to the process chamber, resulting in the dew condensation. The conventional equipments cannot prevent condensation satisfactorily even if the pressure of the process chamber is decreased sufficiently below the base pressure.

On the other hand, cross contamination is caused by a flow of residual gases from a process chamber for heat treatment or photo-assisted CVD, to the wafer transfer chamber if the degree of vacuum in the wafer transfer chamber is too high.

Furthermore, the conventional equipments cannot sufficiently reduce variations of wafer properties such as sheet resistance from wafer to wafer, especially when the wafers are processed in a high temperature silicide CVD chamber. It is possible to reduce the variations of the sheet resistance by decreasing the pressure in the load lock chamber below the above-mentioned level. However, the pumping operation must be continued for three hours or more.

OBJECTS AND SUMMARY OF THE INVENTION

Therefore, it is an object of the present invention to provide multi-chamber process equipments which can efficiently prevent contamination from the ambient air, cross contamination among chambers, and dew condensation.

It is another object of the present invention to provide multi-chamber process equipments which can improve throughput of a complex process.

According to the present invention, a multi-chamber process equipment comprises at least one wafer transfer chamber for transferring at least one wafer, a plurality of process chambers for processing the wafer, a plurality of gate valves (vacuum valves) for connecting the transfer chamber with each of the process chambers, and a wafer transfer means for transferring the wafer between the wafer transfer chamber and each of the process chambers through one of the gate valves. Each gate valve is connected between the transfer chamber and a unique one of the process chambers, and arranged to open and close a gateway extending from the transfer chamber and the corresponding process chamber. One or more or all of the process chambers may be designed to process the wafers in a single (or individual) wafer processing mode. The multi-chamber process equipment according to the invention further comprises a plurality of vacuum pumps which are connected with the transfer chamber and which are designed to reduce the pressure in the transfer chamber to different vacuum levels.

This multi-chamber process equipment can prevent cross contamination by setting the pressure in the transfer chamber at a desired level according to the process chamber to be opened.

According to another aspect of the present invention, a multi-chamber process equipment comprises a wafer transfer chamber which comprises a load lock chamber, a plurality of process chambers which are connected with the wafer transfer chambers, respectively, by gate valves, and a means for introducing a chemically inert gas, such as N2 or Ar, into the load lock chamber while the pressure in the load lock chamber is held at a reduced level.

This multi-chamber process equipment can prevent contaminants due to the ambient air, or degassing from the wafers or the load lock chamber, from flowing from the load lock chamber into the process chambers, by introducing the inert gas into the load lock chamber. This equipment readily prevents the contamination without requiring a long pumping operation to reduce the pressure in the load lock chamber to a high vacuum.

According to still another aspect of the invention, there are provided a plurality of wafer transfer chambers which are designed to be held at different vacuum levels, and a transfer passage (or corridor) through which the wafer can be transferred to and from each of the transfer chambers. Therefore, it is possible to transfer the wafer directly from the load lock chamber to each of the transfer chambers.

According to still another aspect of the present invention, a multi-chamber process equipment comprises a wafer transfer chamber connected with process chambers, respectively, by gate valves, and a plurality of wafer transfer means for transferring the wafer between the wafer transfer chamber and one of the process chambers through one of the gate valves. Each of the wafer transfer means is placed in the wafer transfer chamber, and provided for a unique one of the process chambers. Therefore, this equipment can reduce the time required for wafer processing by preventing the time for wafer transfer from becoming a bottleneck.

According to still another aspect of the invention, a wafer transfer means or each of a plurality of wafer transfer means comprises a plurality of wafer support portions which are selectively used for supporting the wafer. Therefore, it is possible to use one of the support portions for moving the wafer to and from a process chamber for sputtering, and another for a process chamber for CVD.

EMBODIMENTS

First Embodiment

Figure 1:
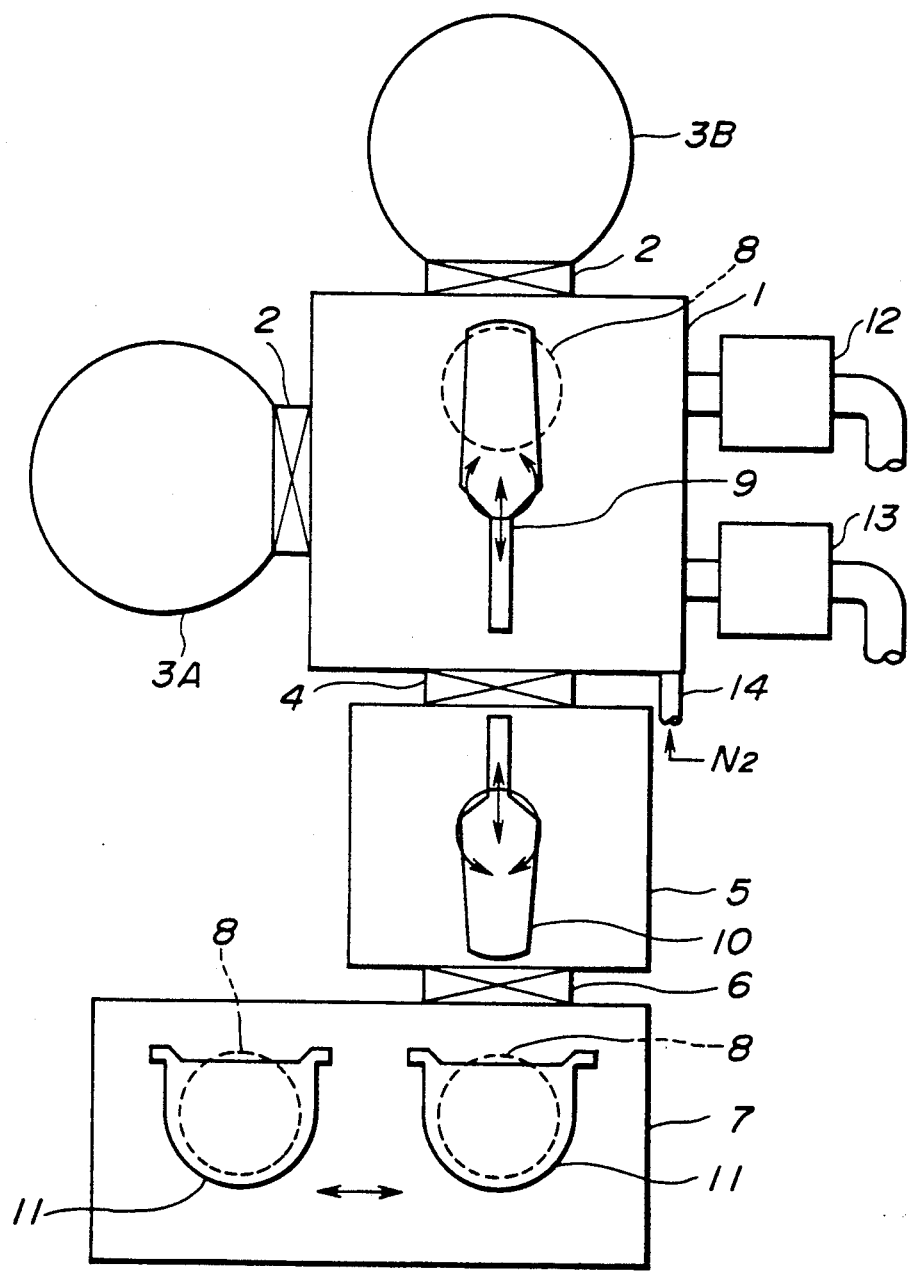
FIG. 1 is a schematic plan view showing a first embodiment of the present invention.

FIG. 1 shows a multi-chamber process equipment according to a first embodiment of the present invention.

This process equipment has a central transfer chamber 1, first and second gate valves (vacuum valves) 2, and a group of process chambers each of which is connected with the transfer chamber 1 through a unique one of the gate valves 2. In this example, the process chamber group includes a low temperature etching chamber 3A, a heat treatment chamber 3B and one or more other process chambers (not shown).

The central transfer chamber 1 is formed by a central housing which is a leak-free enclosure, and each process chamber is formed by one of surrounding housings.

In the wafer transfer chamber 1, there is provided a wafer transfer arm 9 which serves as a wafer transfer means, or one component of the wafer transfer means. A turbo molecular pump 12 and a booster pump 13 are connected in parallel, with the wafer transfer chamber 1. The transfer chamber 1 is further connected with a dry $N_2$ bleed unit (not shown) by a feed pipe 14 for introducing gaseous nitrogen ($N_2$) into the transfer chamber 1.

A base pressure of the low temperature etching chamber 3A is set at $10^{-6}$ Torr, for example. As to the heat treatment chamber 3B, the base pressure is set at $10^{-2}$ Torr, for example. The turbo molecular pump 12 is designed to create a high vacuum in the transfer chamber 1 while the booster pump 13 is for a low vacuum. The attainable ultimate vacuum of the turbo molecular pump 12 is higher than that of the booster pump 13. Each of the pumps 12 and 13 is directly connected with the central wafer transfer chamber 1. The central transfer chamber 1 is formed with a port connected with the turbo molecular pump 12, and another port connected with the booster pump 13.

Figure 14:
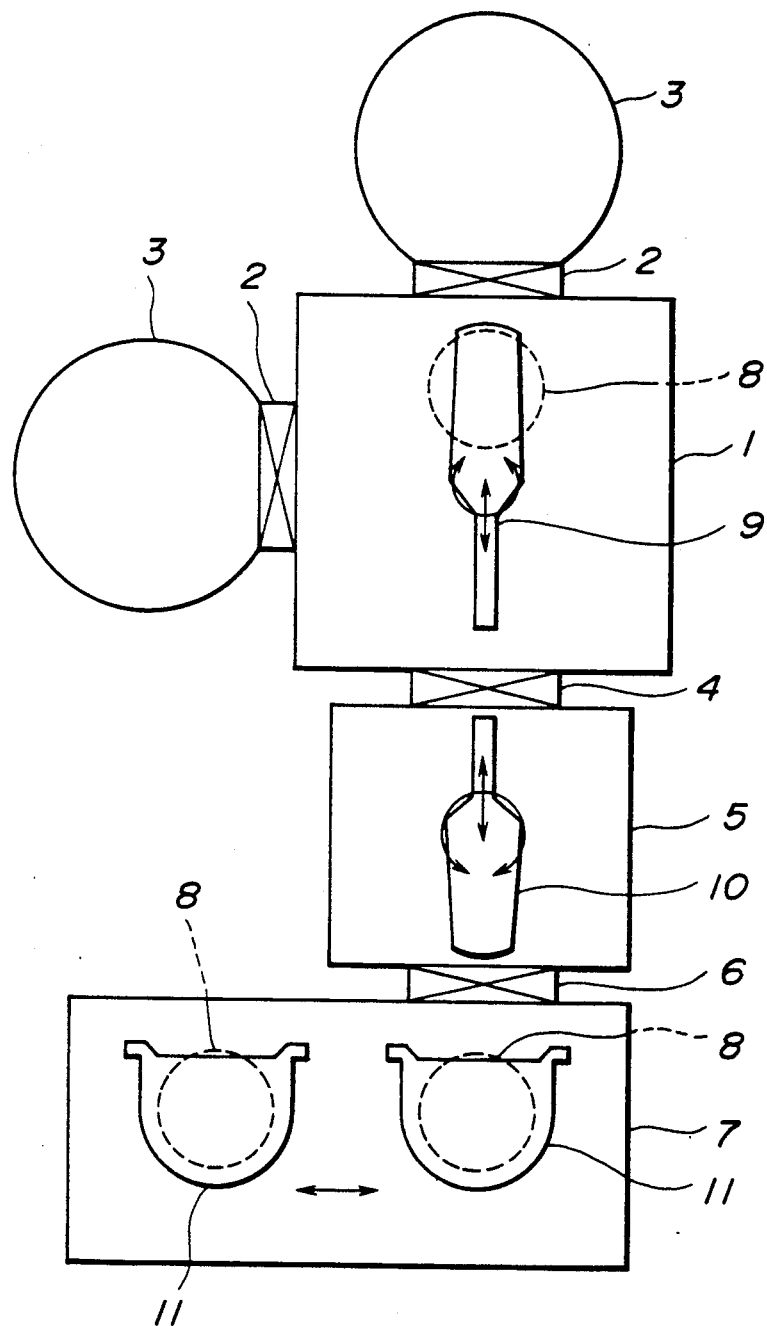
FIG. 14 is a schematic view showing one conventional multi-chamber process equipment.

The process equipment shown in FIG. 1 further includes a load lock chamber 5 and a wafer load chamber 7 which are constructed in the same manner as in the conventional equipment shown in FIG. 14.

In this multi-chamber process equipment, a low temperature etching step is performed as follows: First, the wafer transfer chamber 1 is evacuated by the turbo molecular pump 12 to a high vacuum of $10^{-6}$ Torr, or a slightly higher vacuum than $10^{-6}$ Torr while a wafer 8 is held in the transfer chamber 1. Thereafter, the first gate valve 2 for the low temperature etching chamber 3A is opened, and the wafer 8 is transferred by the transfer arm 9 from the transfer chamber 1 to the low temperature etching chamber 3A through the opened first gate valve 2. In this case, the degree of vacuum in the wafer transfer chamber 1 is held equal to or higher than that in the lower temperature etching chamber 3A. This vacuum condition prevents residual water and contamination from flowing into the low temperature etching chamber 3A. Therefore, it is possible to prevent dew condensation due to the low temperature etching, by holding the partial pressure of water in the central transfer chamber 1, at a low level.

After the low temperature etching step in the chamber 3A, the etched wafer 8 is shifted to the heat treatment chamber 3B. The wafer 8 is returned from the heat treatment chamber 3B to the central transfer chamber 1 in the following manner, when heating to prevent condensation and ashing are performed. First, the booster pump 13 is operated to evacuate the central transfer chamber 1, and the gaseous nitrogen is introduced from the dry $N_2$ bleed unit through the pipe 14. When the pressure in the central transfer chamber 1 reaches $10^{-2}$ Torr, the second gate valve 2 is opened, and the wafer 8 is taken out from the heat treatment chamber 3B to the central transfer chamber 1 by the transfer arm 9. In this case, the central transfer chamber 1 and the heat treatment chamber 3B are equal in the degree of vacuum, so that cross contamination from the heat treatment chamber 3B is prevented.

In the example shown in FIG. 1, the process chamber group includes the low temperature etching chamber 3A and the heat treatment chamber 3B. However, it is optional to employ any one or more of other process chambers instead of either or both of these chambers 3A and 3B, or in addition to these chambers 3A and 3B. For example, the central transfer chamber 1 may be connected by another gate valve with a process chamber for photo-assisted CVD. FIG. 1 shows only the two vacuum pumps 12 and 13 of different types. However, the vacuum pump group may includes three or more vacuum pumps which can attain different degrees of vacuum.

The equipment shown in FIG. 1 has the load lock chamber 5 which is separate from the central transfer chamber 1 by the gate valve 4. However, the central transfer chamber 1 and the load lock chamber 5 may be integrated into a single chamber.

Second Embodiment

Figure 2:
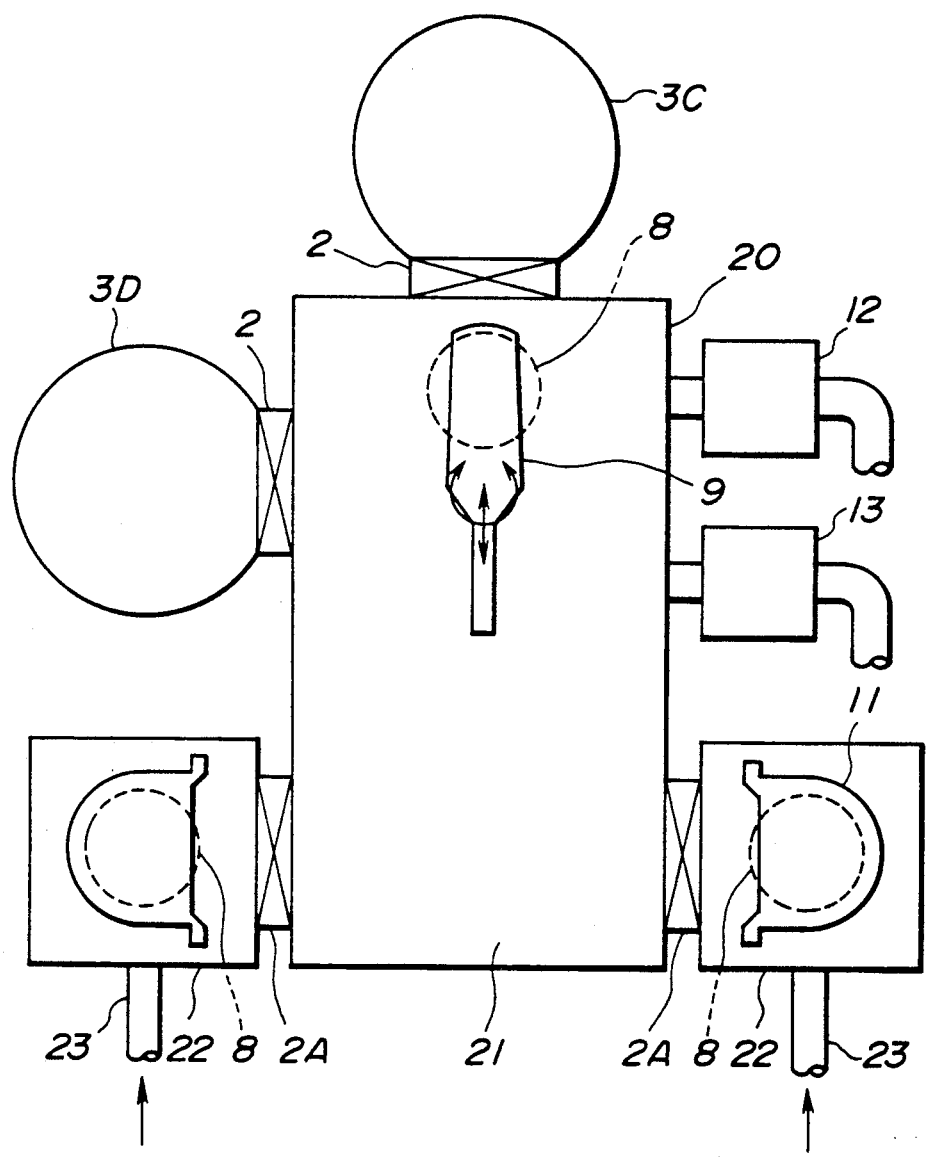
FIG. 2 is a schematic plan view showing a second embodiment of the present invention.

FIG. 2 shows a multi-chamber process equipment (or system) according to a second embodiment of the present invention.

This process equipment includes a central transfer chamber 20, and a process chamber group including a high temperature tungsten silicide CVD chamber 3C and a heat treatment chamber 3D. The center transfer chamber 21 is connected with the CVD chamber 3C by a first gate valve 2, and the heat treatment chamber 3D by a second gate valve 2. The process chambers 3C and 3D are connected in parallel, with the center transfer chamber 21. In this example, the central chamber 20 is a rectangular chamber, and the first and second gate valves 2 and 2 are fixed, respectively to two adjacent sides of the rectangular central transfer chamber 21.

A part of the central chamber 20 is used as a load lock chamber 21. The process equipment further includes first and second cassette chambers 22 which are connected with both sides of the load lock chamber 21 by third and fourth gate valves 2A. A wafer cassette 11 for holding one or more wafers 8 is placed in each cassette chamber 22. The equipment further includes a wafer transfer robot arm 9 provided in the central transfer chamber 20. The arm 8 is designed to move each wafer to and from each of the load lock chamber, process chambers and cassette chambers.

A turbo molecular pump 12 and a booster pump 13 are connected in parallel, with the central transfer chamber 20 as in the first embodiment. Each of the cassette chambers 22 is connected with an inert gas supply pipe 23 for introducing a chemically inert gas such as nitrogen gas ($N_2$) or argon gas (Ar).

In this process equipment, a tungsten silicide film is formed on a wafer 8 in the following manner. Two methods are possible. In the first method, one of the cassette chambers 22 is opened by opening its gate valve 2A, and a nitrogen gas flow is introduced through the nitrogen gas supply pipe 23 while the pressure in the load lock chamber 21 and the opened cassette chamber 22 is held at 10 mTorr by the booster pump 13. In the second method, the turbo molecular pump 12 is driven to pump down the load lock chamber 21 and at least one of the cassette chambers 22 once to about $10^{-5}$ Torr (for several minutes). Then, the pressure is held at 100 mTorr while the nitrogen gas is being admitted through the inert gas feed pipe 23.

After the preparation by one of these two methods, one wafer is transferred into the high temperature tungsten silicide CVD chamber 3C by the wafer transfer arm 9, the gate valve 2 is closed, and a film is formed by the CVD process.

Figure 3:
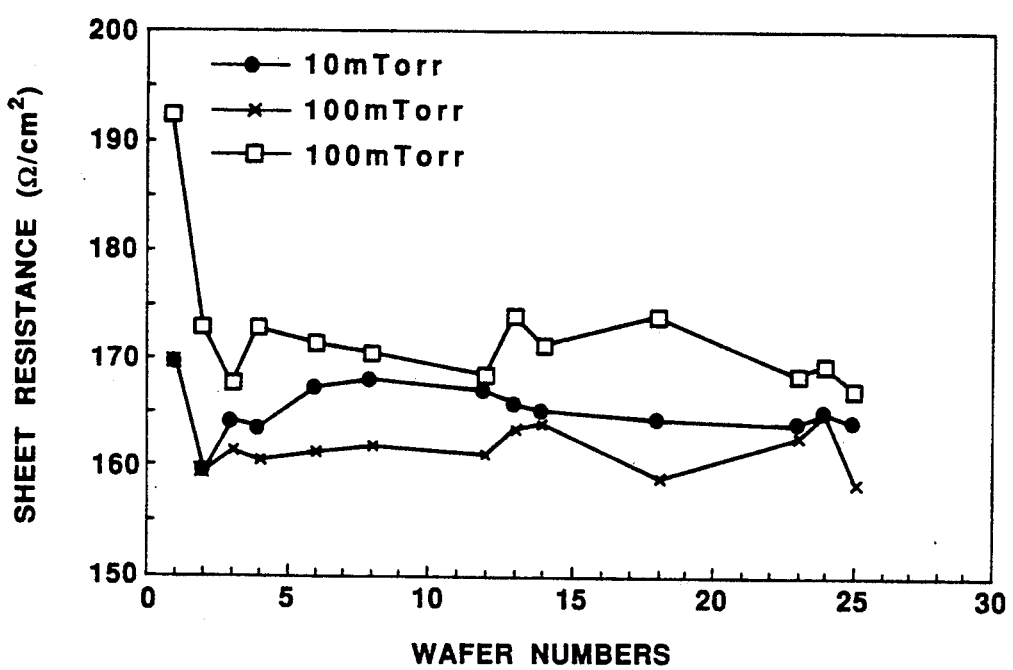
FIG. 3 is a graph showing variations in sheet resistance among processed wafers on which tungsten silicide films are formed by the equipment according to the second embodiment.

The graph of FIG. 3 shows the sheet resistances (Rs) of tungsten silicide films, formed on wafers to a thickness of 1000 Å by using the multi chamber process equipment according to the second embodiment. In the graph of FIG. 3, the results of the above-mentioned first method are plotted by small black round marks (•), and the results of the second method are marked with small cross marks (x). A plot with small white square marks shows a comparable example in which the pressure of the load lock chamber is preliminarily reduced to 100 mTorr without introducing the nitrogen gas. As evident from FIG. 3, the multi-chamber process equipment of this embodiment makes it possible to reduce the dispersion of values of the sheet resistance among the processed wafers below 2% by introducing the insert gas into the load lock chamber (and the cassette chamber). This equipment using an inert gas facilitates production of processed wafers of uniform properties.

Figure 4:
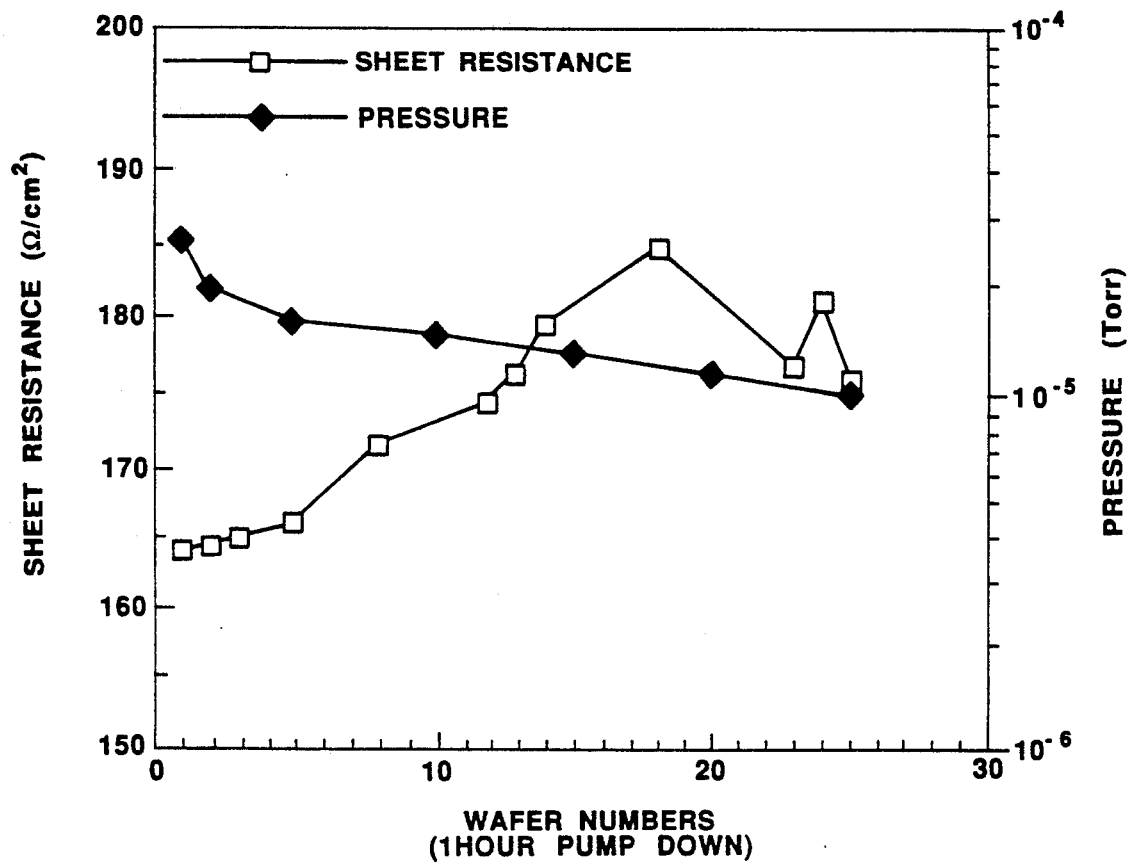
FIG. 4 is a graph showing a sheet resistance and a pressure in one comparative example of a one hour pump down period.
Figure 5:
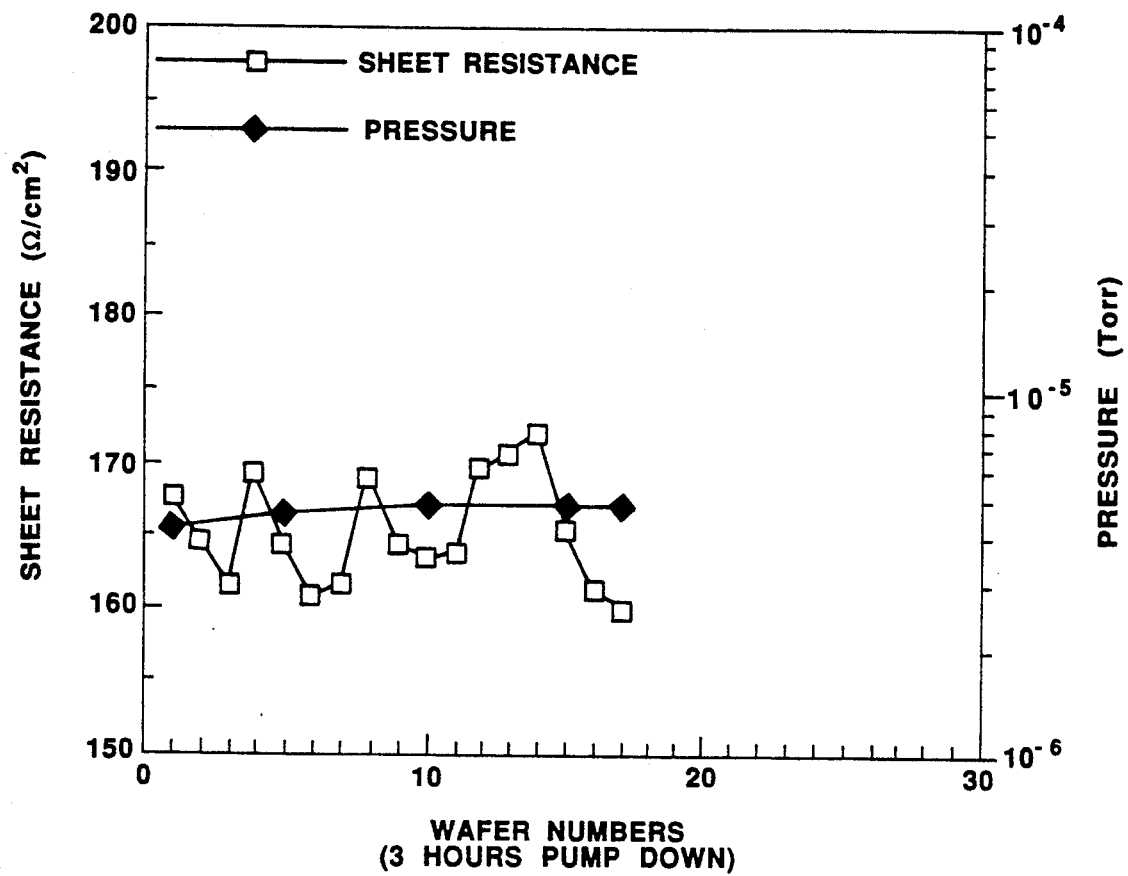
FIG. 5 is a graph showing the sheet resistance and pressure in another comparative example of a pump down period of three hours.
Figure 6:
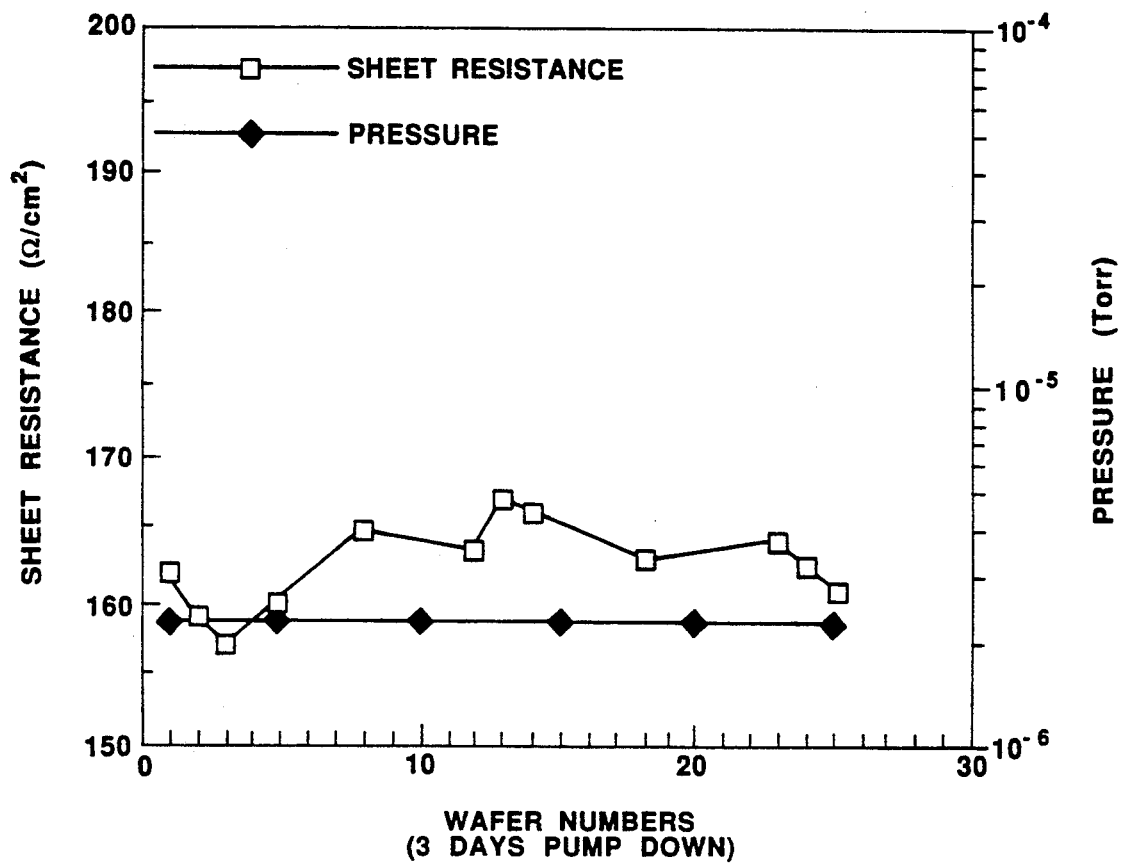
FIG. 6 is a graph showing the sheet resistance and pressure in a comparative example of a pump down period of three days.

FIGS. 4, 5 and 6 show the results of other comparable examples. In the case of FIG. 4, the load lock chamber is evacuated by a vacuum pump for one hour, and then a wafer is loaded in the high temperature tungsten silicide CVD chamber to deposit a tungsten silicide film to a thickness of 1000 Å. The lock lock chamber pressure is measured when each wafer is passing through the load lock chamber. FIG. 4 shows a relationship between the sheet resistance and the load lock chamber pressure. FIG. 5 shows a relationship between the load lock chamber pressure and the sheet resistance of a tungsten silicide film formed after a 3 hour pump down period. FIG. 6 shows a relationship between the load lock chamber pressure and the sheet resistance of a tungsten silicide film formed after a pump down period of 3 days. In these examples, the pumping operation of the vacuum pump for three days is required to sufficiently reduce the wafer to wafer variations in the sheet resistance, and achieve a stable condition. In sharp contrast to this, the multi-chamber process equipment of the second embodiment can reduce the dispersion in the sheet resistance to a level equal to or lower than 2%, and enhance the throughput strikingly, without requiring a long pump down operation. In this embodiment, the required condition is reached by a pump down of only several minutes.

In the example shown in FIG. 2, the inert gas feed pipe 23 is connected to each cassette chamber. However, it is optional to connect an inert gas supply means directly to the load lock chamber 21. It is possible to use Ar or other inert gas instead of nitrogen gas.

The arrangement of the second embodiment is applicable not only to the high temperature tungsten silicide CVD chamber, but also to various other process chambers. In any case, the multi-chamber process equipment according to the second embodiment can prevent contaminants from the atmospheric air and contaminants due to degassing of wafers and other processing materials from entering the process chambers from the load lock chamber and the cassette chambers.

The pressure level employed in each of the above-mentioned first and second methods is merely one example. It is possible to adjust these pressure levels appropriately.

Third Embodiment

Figure 7:
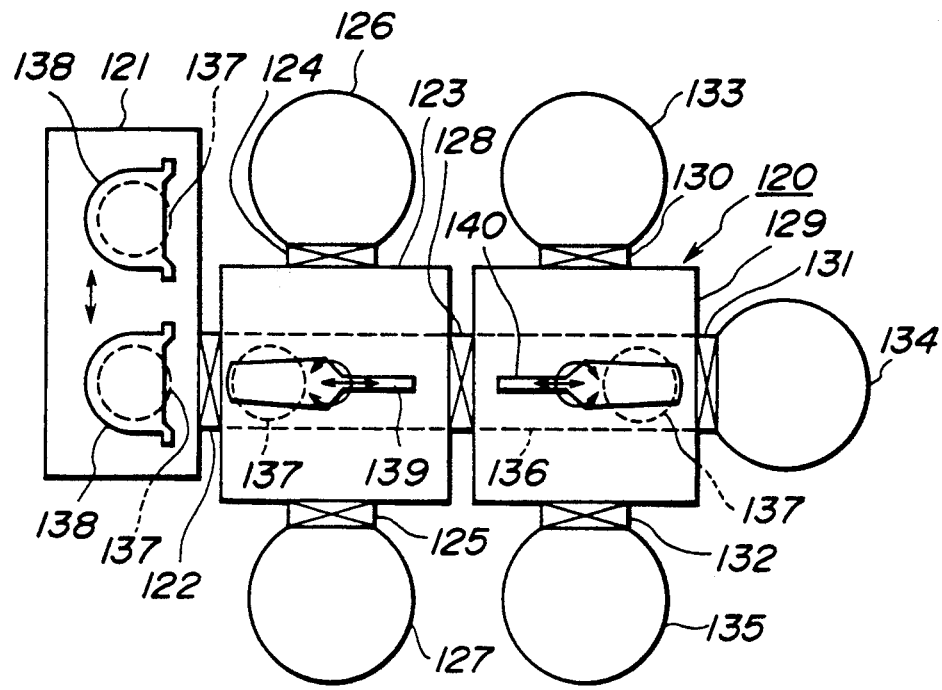
FIG. 7 is a schematic plan view showing a multi-chamber process equipment according to a third embodiment of the present invention.

FIG. 7 shows a multi-chamber process equipment 120 according to a third embodiment of the present invention.

This process equipment includes a wafer load chamber 121 and a first transfer chamber 123, which are connected together by a gate valve 122. First and second process chambers 126 and 127 are connected with the first transfer chamber 123, respectively, by gate valves 124 and 125.

This equipment 120 further includes second and third transfer chambers 129 and 136. The second transfer chamber 129 is connected with the first transfer chamber 123 by a gate valve 128. Third, fourth and fifth process chambers 133, 134 and 135 are connected with the second transfer chamber 129, respectively, by gate valves 130, 131 and 132. The third transfer chamber 136 extends below the first and second transfer chambers 123 and 129, and serves as a transfer passage (corridor) for conveying a wafer to each of the first and second transfer chambers 123 and 129.

Figure 8:
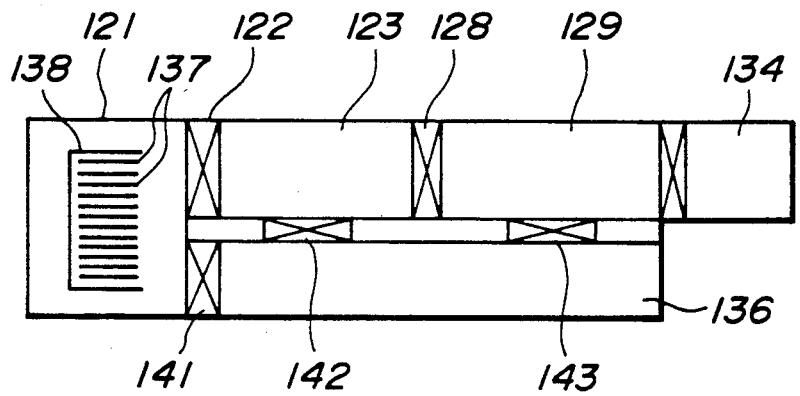
FIG. 8 is a side view of the equipment shown in FIG. 7.

The wafer load chamber 121 has a function of preliminary evacuation. As shown in FIGS. 7 and 8, there is placed, in the wafer load chamber 121, a wafer cassette (or wafer cassettes) for storing a plurality of wafers 137. There are provided well-known arms 139 and 140 for wafer transfer, respectively, in the first and second transfer chambers 123 and 129. By these wafer transfer arms 139 and 140, each of the wafers 137 can be transferred to each process chamber.

The third transfer chamber 136 is connected with the wafer load chamber 121, and the first and second transfer chambers 123 and 129, respectively, by gate valves 141, 142 and 143. In the third transfer chamber 136, there is provided a wafer transfer means (not shown) for transferring each wafer into and out of each of the wafer load chamber 121 and the first and second transfer chambers 123 and 129.

In this example, etching chamber, CVD chamber and RTP (heat treatment) chamber can be employed as the first and second process chambers 126 and 127 connected with the first transfer chamber 123. PVD chambers can be employed as the process chambers 133, 134 and 135 connected with the second transfer chamber 129. According to the preset pressures of these process chambers, the degree of vacuum of the first wafer transfer chamber 123 is set at a value lower than that of the second wafer transfer chamber 129.

In the multi-chamber process equipment according to the third embodiment, a tungsten substitution process can be performed as follows: First, a wafer formed with contact holes is transferred through the third transfer chamber 136 from the wafer load chamber 121 to the second wafer transfer chamber 129. Then, the wafer is loaded by the transfer arm 140 in the process chamber 133 for sputtering, and titanium nitride (TiN) is deposited under controlled conditions. For example, this sputtering process is accomplished by using a titanium (Ti) target, introducing oxygen ($O_2$) gas at $100_{SCCM}$, and nitrogen gas ($N_2$) at $6_{SCCM}$, and using 2.0 KW (DC), 300 W (RF bias).

After completion of the sputtering, the wafer is shifted through the second wafer transfer chamber 129 to the first wafer transfer chamber 123. Then, the wafer is loaded in the CVD process chamber 126, and a polycrystalline silicon film is formed by blanket growth. Thereafter, blanket etch back is performed on the entire surface. The CVD and etch back processes are preformed under the following conditions, for example.

<CVD conditions> (1) Ambient gas and its flow rate; Silane ($SiH_4$) ... $100_{SCCM}$; (2) Pressure; 0.6 Torr: (3) Temperature; 680° C.

<Etch back conditions>... (1) Etching gas and its flow rate; Sulfur hexafluoride ($SF_6$) ... $30_{SCCM}$, and Nitrogen ($N_2$) ... $10_{SCCM}$ (2)Pressure; 0.015 Torr: (3) Output; 0.23 W/cm$^2$.

Then, this wafer is transferred to the process chamber 127 for heat treatment, and the polycrystalline silicon filled in the contact holes is substituted for tungsten (W). This heat treatment is performed under the following conditions, for example. (1) Ambient gas and its flow rate; Tungsten hexafluoride ($WF_6$) ... $20_{SCCM}$, and nitrogen ($N_2$) ... $2000_{SCCM}$ (2) Pressure; 2.75 Torr: (3) Temperature; 300° C.

The multi-chamber process equipment according to the third embodiment is applicable to not only the process for tungsten replacement as in the above example, but also other processes. There are various compound processes which can be performed advantageously in this equipment in such a manner that a process is performed in one process chamber connected with the second wafer transfer chamber 123 before a process in one process chamber connected with the first transfer chamber 123. In these compound processes, utilization of the third wafer transfer chamber 136 improves the throughput.

The third transfer chamber 136 of the illustrated example is arranged so that wafers can be conveyed to each of the two transfer chambers 123 and 129. However, the third transfer chamber 136 of the third embodiment may extend over three or more transfer chambers, and serve as a corridor for conveying wafers to each of the three or more transfer chambers.

Fourth Embodiment

Figure 9:
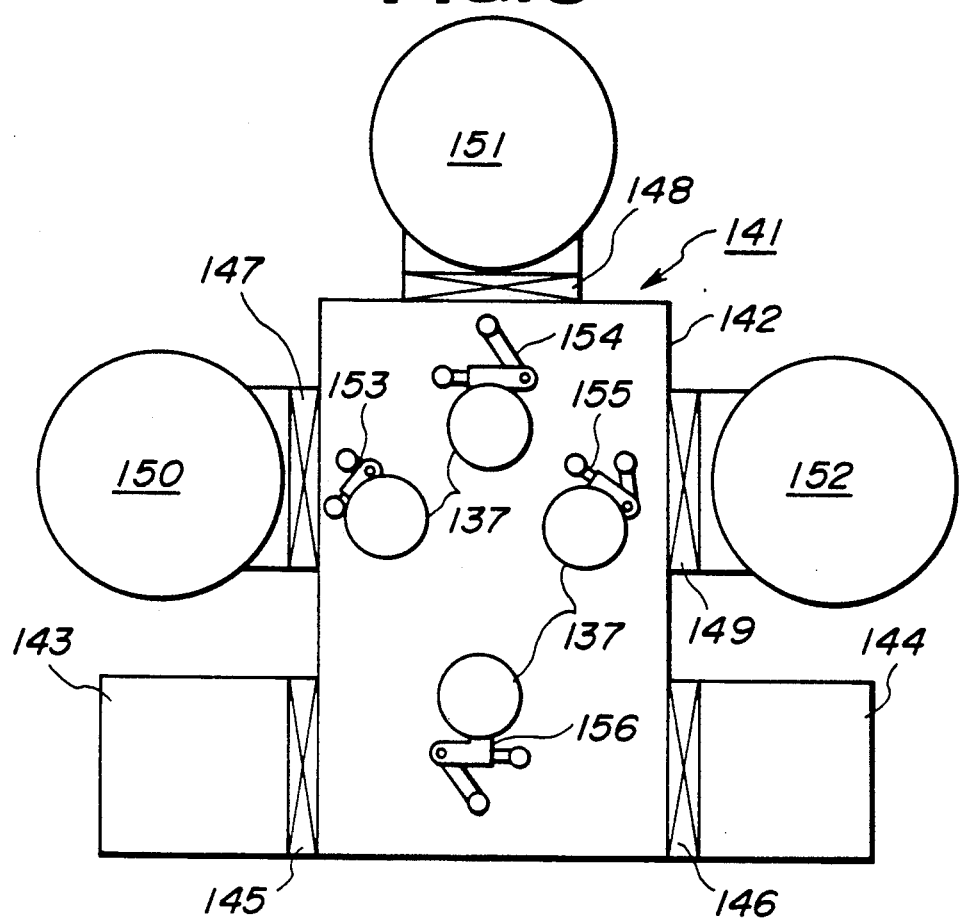
FIG. 9 is a schematic plan view showing a multi-chamber process equipment according to a fourth embodiment of the invention.

FIG. 9 shows a multi-chamber process equipment according to a fourth embodiment of the present invention.

A multi-chamber process equipment 141 shown in FIG. 9 includes a central wafer transfer chamber 142, wafer load and unload chambers 143 and 144 which are connected with the central chamber 142, respectively, by gate valves 145 and 146, and a plurality of parallel process chambers 150, 151 and 152 which are connected with the central chamber 142, in parallel to each other, by gate valves 147, 148 and 149, respectively. The wafer transfer chamber 142 has a function of load lock (preliminary evacuation).

In the central transfer chamber 142, there are provided wafer transfer arms 153, 154 and 155 at positions near the gate valves 147, 148 and 149. The first, second and third transfer arms 153, 154 and 155 confront the first, second and third process chambers 150, 151 and 152, respectively. A fourth wafer transfer arm 156 is provided in the central chamber 142 at a position between the load and unload chambers 143 and 144. The arm 156 is designed to transfer a wafer 137 from the load chamber 143 to the central chamber 142 and from the central chamber 142 to the unload chamber 144, and to deliver the wafer to each of the arms 153, 154 and 155.

The transfer arms 153, 154 and 155 are designed to move the wafer 137 into and out of the process chambers 150, 151 and 152, respectively. Each of the arms 153, 154 and 155 can pass the wafer to another, and receive the wafer from another. Furthermore, each of the arms 153, 154 and 155 can receive the wafer from the fourth arm 156, and return the wafer to the fourth arm 156. Each transfer arm may include a well known crank mechanism, or may be constructed in any other way.

In this embodiment, one wafer transfer arm is provided for each of the process chambers, so that the wafer can be removed immediately after the process in each process chamber. Therefore, this equipment can prevent the rate of wafer processing from being limited by the time required for wafer transfer, and improve the throughput by avoiding the waste of time in leaving a wafer waiting in a process chamber.

In the fourth embodiment, the multi-chamber process equipment can be modified in various manners. For example, there may be further provided a buffer station in which one or more wafers can rest on standby. In this case, the wafer 137 is transferred among the transfer arms through the buffer station, or the wafer transfer between the arm 156 and each of the arms 153, 154 and 155 is performed through the buffer station.

When the interior space of the central transfer chamber 142 is narrow, it is possible to prevent interference among the transfer arms by positioning the arms at different heights.

The fourth embodiment is applicable to multiple-chamber process equipments having two or more wafer transfer chambers.

Figure 10:
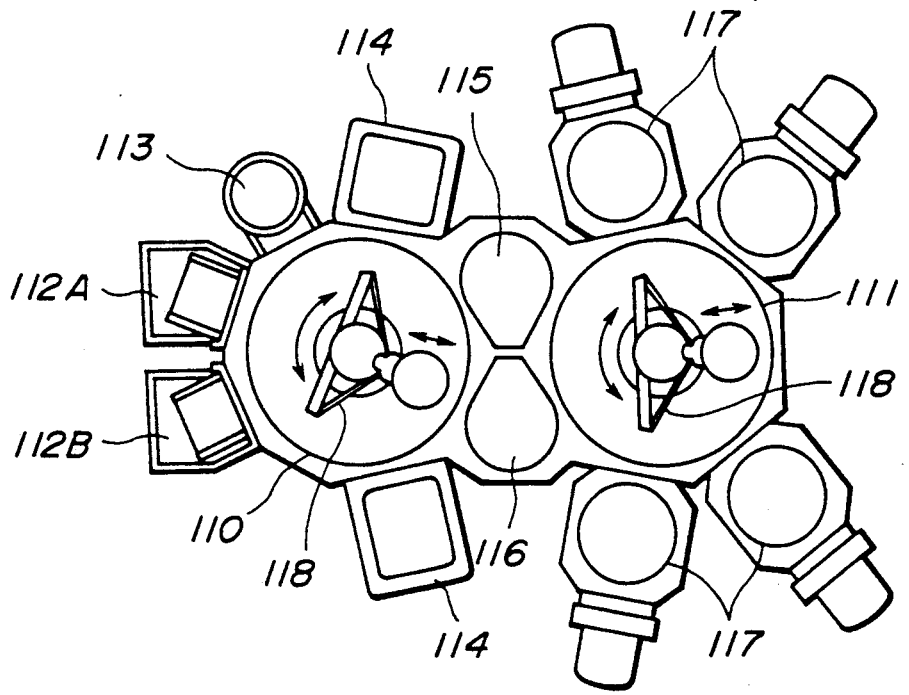
FIG. 10 is a schematic plan view showing one convention equipment.

FIG. 10 shows a conventional multi-chamber process equipment (disclosed in "NIKKEI MICRODEVICES", May, 1990, page 47. This equipment includes first and second wafer transfer chambers 110 and 111 of different degrees of vacuum. The first wafer transfer chamber 110 is connected with load lock chambers 112A and 112B, a wafer positioning chamber 113, RTP/etching/CVD chambers 114 by gate valves. The first wafer transfer chamber 110 is further connected with the second wafer transfer chamber 111 through a preclean chamber 115 and a cooling chamber 116. A plurality of parallel PVD chambers 117 are connected with the second wafer transfer chamber 111. The base pressures of these chambers are set as follows: The load lock chambers 112A and 12B are at $10^{-5}$ Torr; the first wafer transfer chamber 110 is at $10^{-6}$ Torr; the positioning chamber 113 is at $10^{-6}$ Torr; the RTP/etching/CVD chambers 114 are at $10^{-6}$ Torr; the preclean chamber 115 and cooling chamber 116 are at $10^{-7}$ Torr; the second wafer transfer chamber 111 is at $10^{-8}$ Torr; and the PVD chambers 117 are at $10^{-9}$ Torr. In general, the base pressure of the wafer transfer chamber is higher than that of the process chambers, and lower than that of the load lock chamber.

This conventional equipment is disadvantageous as compared with the multi-chamber process equipment shown in FIG. 7. In the sequence of sputtering→CVD-→heat treatment in which the process requiring a higher vacuum precedes the others, a wafer must be first transferred to one PVD chamber 118 for sputtering, through the first transfer chamber 110 of a lower vacuum. Therefore, the access time becomes longer and the throughput of the total processing becomes worse. Furthermore, the conventional equipment shown in FIG. 10 has only one transfer arm in each transfer chamber unlike the equipment shown in FIG. 9. Therefore, it is not possible to take out a processed wafer from one process chamber while the transfer arm is carrying another wafer. In contrast to this, the multi-camber process equipment shown in FIG. 9 can improve the throughput by facilitating parallel processing in a plurality of process chambers.

Fifth Embodiment

Figure 11:
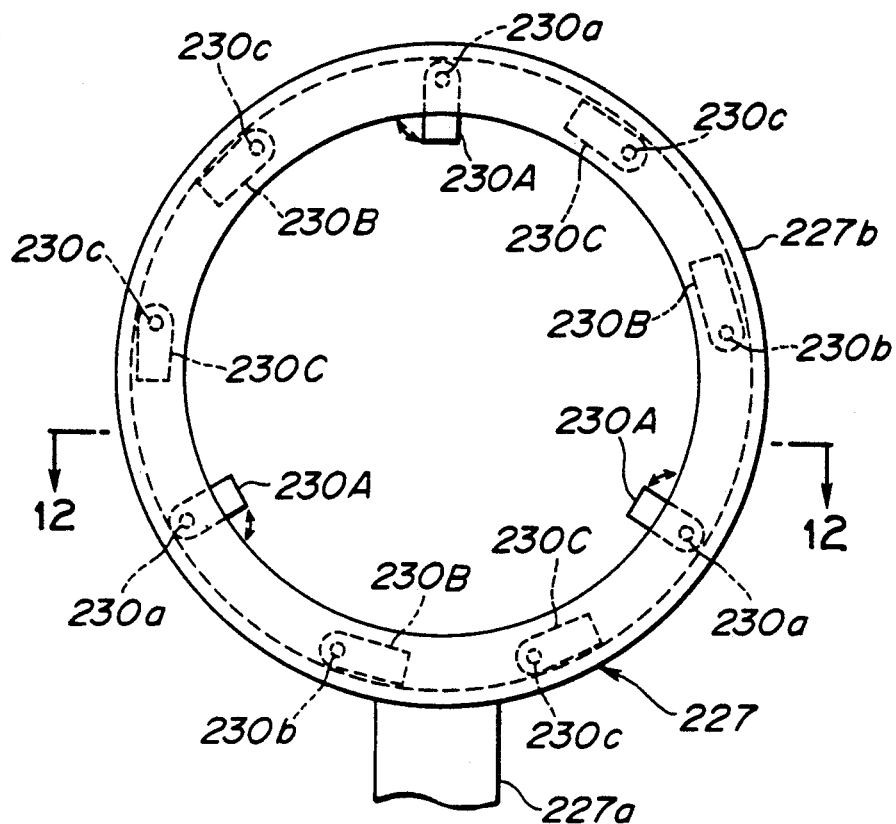
FIG. 11 is a plan view showing one wafer transfer arm employed in a multi-chamber process equipment according to a fifth embodiment of the invention.
Figure 12:
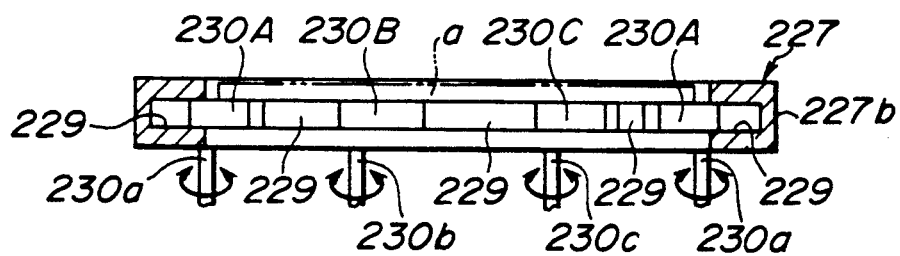
FIG. 12 is a sectional view taken across a line A—A in FIG. 11.
Figure 13:
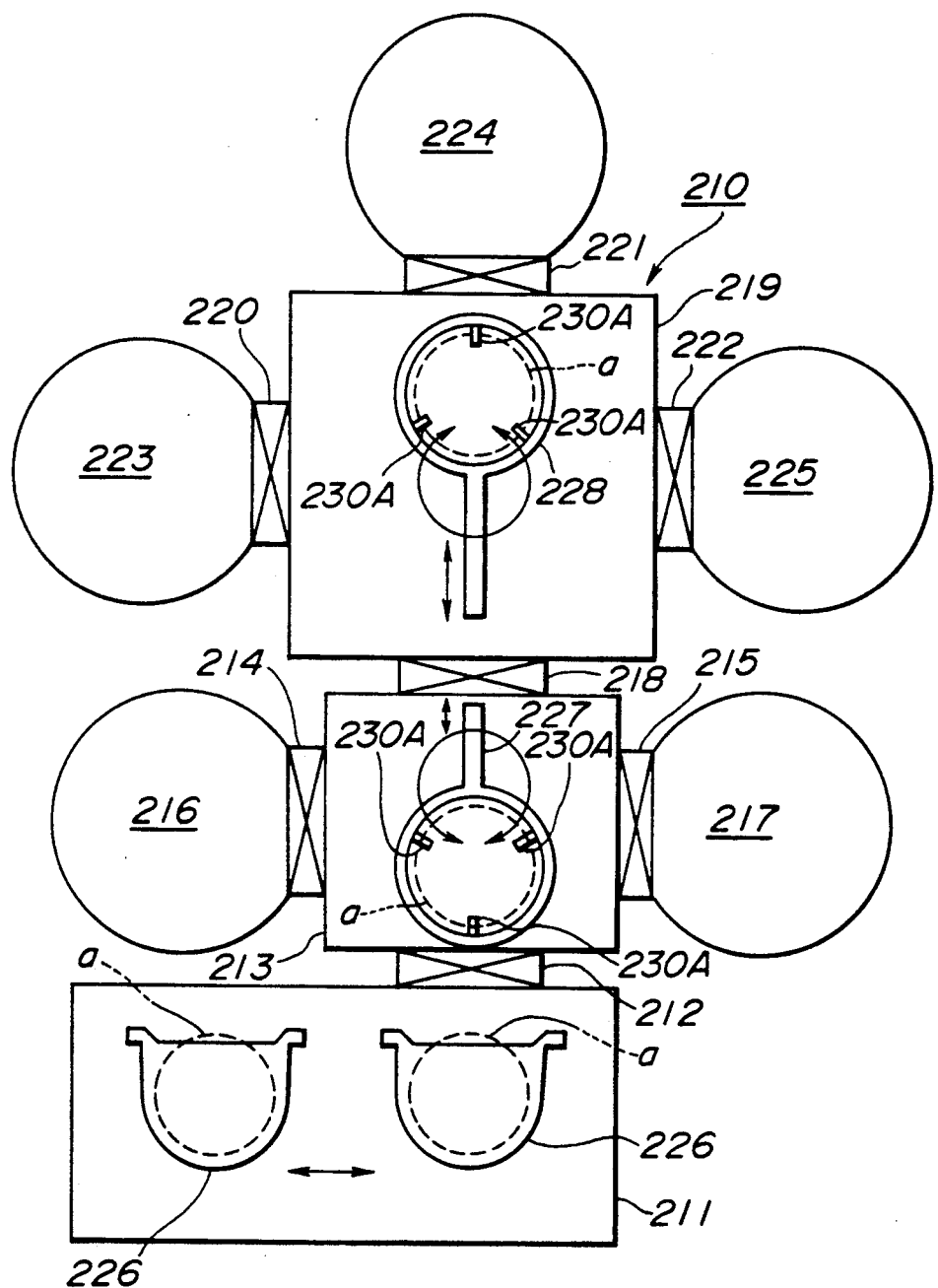
FIG. 13 is a plan view of the multi-chamber process equipment according to the fifth embodiment of the invention.

FIGS. 11, 12 and 13 show a multi-chamber process equipment according to a fifth embodiment of the present invention.

As shown in FIG. 13, the multi-chamber process equipment 210 includes a wafer load chamber 211, and first and second wafer transfer chambers 213 and 219. The first transfer chamber 213 is connected with the wafer load chamber 211 by a gate valve 212. Process chambers 216 and 217 are connected with both sides of the first transfer chamber 213 by gate valves 214 and 215, respectively. The second transfer chamber 219 is connected with the first transfer chamber 213 by a gate valve 218. Process chambers 223, 224 and 225 are connected with the second transfer chamber 219 by gate valves 220, 221 and 222, respectively.

The wafer load chamber 211 has a function of preliminary evacuation, and houses at least one wafer cassette 226 in which a plurality of wafers a are stored. First and second transfer arms 227 and 228 are placed, respectively, in the first and second transfer chambers 213 and 219. The transfer arms 227 and 228 serve as a wafer transfer means for transferring each wafer a to each process chamber.

In this example, the process chambers 216 and 217 may be designed to perform etching process and/or CVD process, and the process chambers 223, 224 and 225 may be designed to perform PVD process. In this example, the degree of vacuum in the first wafer transfer chamber 223 is made lower than that of the second transfer chamber 229 according to the preset pressures of these process chambers.

In the first and second wafer transfer chambers 213 and 219, there are provided the wafer transfer arms 227 and 228 for moving the wafer into and out of each process chamber. As shown in FIG. 11, the wafer transfer arm 227 has an arm portion 227a and a ring portion 227b which is integrally formed at one end of the arm portion 227a. The ring portion 227b has a circular opening whose inner diameter is slightly greater than the diameter of the wafer a. The ring portion 227b further has an annular groove 229 opening radially inwardly. The annular groove 229 is bounded by a cylindrical side wall, and upper and lower flat ring-shaped walls. The annular groove 229 receives a set of three first fingers 230A, a set of three second fingers 230B and a set of three third fingers 230C for supporting the wafer a. Each of these nine fingers is pivotally supported in the annular groove 229. The three fingers of each set are arranged in a circle at regular angular intervals of 120°. Each of the nine fingers has a pivot shaft 230a, 230b or 230c which is integrally formed with the corresponding finger. Each pivot shaft extends downwardly from the underside of one end portion of the corresponding finger so that the pivot shaft is perpendicular to the finger. Each pivot shaft passes through the lower wall of the annular groove 229, and is connected with a rotation drive system (not shown). Each of the pivotal shafts 230a, 230b and 230c can be rotated by torque transmitted from the drive system, and accordingly each of the fingers 230A, 230B and 230C can be projected from, and retracted in, the annular groove 229. The drive system is arranged to drive the pivot shafts 230a, 230b and 230c selectively. Therefore, it is possible to safely support the wafer a by holding the three fingers of any one of the three sets in their respective projected positions. In FIG. 11, the arm 227 can carry the wafer with the three first fingers 230A in the projected positions.

The second wafer transfer arm 228 is constructed in the same manner as the first transfer arm 227.

The multi-chamber process equipment according to the fifth embodiment makes it possible to select a proper one from the three sets of the fingers for each process. For example, the set of the three first fingers 230A is used for taking out the wafer from the process chamber 216 for CVD, the set of the three second fingers 230B is used for taking out the wafer from the process chamber 217 for dry etching, and the set of the three third fingers 230C is used for taking out the wafer from the wafer load chamber 211. In this way, this equipment can prevent cross contamination among the chambers effectively. The fingers of the second transfer arm 228 are selectively used in the same manner.

The equipment 210 shown in FIG. 13 has the two transfer chambers 213 and 219. However, the arrangement of the transfer arm according to the fifth embodiment is applicable to equipments having only one transfer chamber, or equipment having three or more transfer chambers.

The arrangement of the wafer support fingers can be modified in various manners. For example, the number of the finger sets can be decreased to two, or increased beyond three, or the number of the fingers of each set can be increased. In the illustrated example of FIGS. 11-13, each finger is swingable. However, it is possible to arrange the fingers so that the fingers can project and retract rectilinealy. Furthermore, it is possible to employ a solenoid system for moving the fingers electromagnetically.

As explained above, the multi-chamber process equipment according to the fifth embodiment can prevent cross contamination among different processes, and improve the reliability of the produced semiconductor devices.

What is claimed is:

1. A multi-chamber process equipment comprising:
    a wafer transfer chamber for wafer transfer;
    a plurality of process chambers for processing a wafer;
    a plurality of gate valves each of which connects a unique one of said process chambers with said wafer transfer chamber so that said process chambers are connected with said wafer transfer chamber in parallel to one another; and
    a plurality of wafer transfer means for transferring the wafer between said wafer transfer chamber and one of said process chambers through one of said gate valves, each of said wafer transfer means being placed in said wafer transfer chamber, each of said wafer transfer means being provided for a unique one of said process chambers so that each of said wafer transfer means is assigned to a unique one of said process chambers;
    whereby each of said transfer means is capable of transferring a wafer directly to any other of said transfer means.

2. A multi-chamber process equipment comprising:
    a wafer transfer chamber for wafer transfer;
    a plurality of process chambers for processing a wafer;
    a plurality of gate valves each of which connects a unique one of said process chambers with said wafer transfer chamber so that said process chambers are connected with said wafer transfer chamber in parallel to one another; and
    a wafer transfer means for transferring the wafer between said wafer transfer chamber and each of said process chambers through one of said gate valves;
    wherein said wafer transfer means comprises a plurality of wafer support portions which are arranged so that one of said support portions can be selected from said support portions for each of different processes;
    whereby each of said transfer means is capable of transferring a wafer directly to any other of said transfer means.

* * * * *